(12) United States Patent
Ehmke et al.

(10) Patent No.: US 9,140,898 B2
(45) Date of Patent: Sep. 22, 2015

(54) HERMETICALLY SEALED MEMS DEVICE AND ITS FABRICATION

(71) Applicant: TEXAS INSTRUMENTS INCORPORATED, Dallas, TX (US)

(72) Inventors: John C. Ehmke, Garland, TX (US); Virgil C. Ararao, Plano, TX (US); Toby R. Linder, Dallas, TX (US); Lance W. Barron, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 13/840,688

(22) Filed: Mar. 15, 2013

(65) Prior Publication Data

US 2014/0268295 A1 Sep. 18, 2014

(51) Int. Cl.
*G02B 26/00* (2006.01)
*G02B 26/08* (2006.01)
*B81C 1/00* (2006.01)

(52) U.S. Cl.
CPC ........ *G02B 26/0833* (2013.01); *B81C 1/00317* (2013.01)

(58) Field of Classification Search
CPC .............. B82Y 30/00; G02B 26/0833; G02B 26/0841; H01L 2924/1461; B81C 1/00333
USPC .................................................... 359/290, 291
See application file for complete search history.

(56) References Cited

U.S. PATENT DOCUMENTS

2012/0319303 A1* 12/2012 Foster et al. .................. 257/787

* cited by examiner

*Primary Examiner* — Mahidere Sahle
(74) *Attorney, Agent, or Firm* — Jacqueline J. Garner; Frank D. Cimino

(57) ABSTRACT

A hermetic package comprising a substrate (110) having a surface with a MEMS structure (101) of a first height (102), the substrate hermetically sealed to a cap (120) forming a cavity over the MEMS structure; the cap attached to the substrate surface by a vertical stack (130) of metal layers adhering to the substrate surface and to the cap, the stack having a continuous outline surrounding the MEMS structure while spaced from the MEMS structure by a distance (140); the stack having a bottom metal seed film (131) adhering to the substrate with a first width (131a), and further a top metal seed film (132) adhering to the cap with a second width (132a) smaller than the first width, the top metal seed film tied to a layer (135) including gold-indium intermetallic compounds, layer (135) having a height greater than the first height.

21 Claims, 6 Drawing Sheets

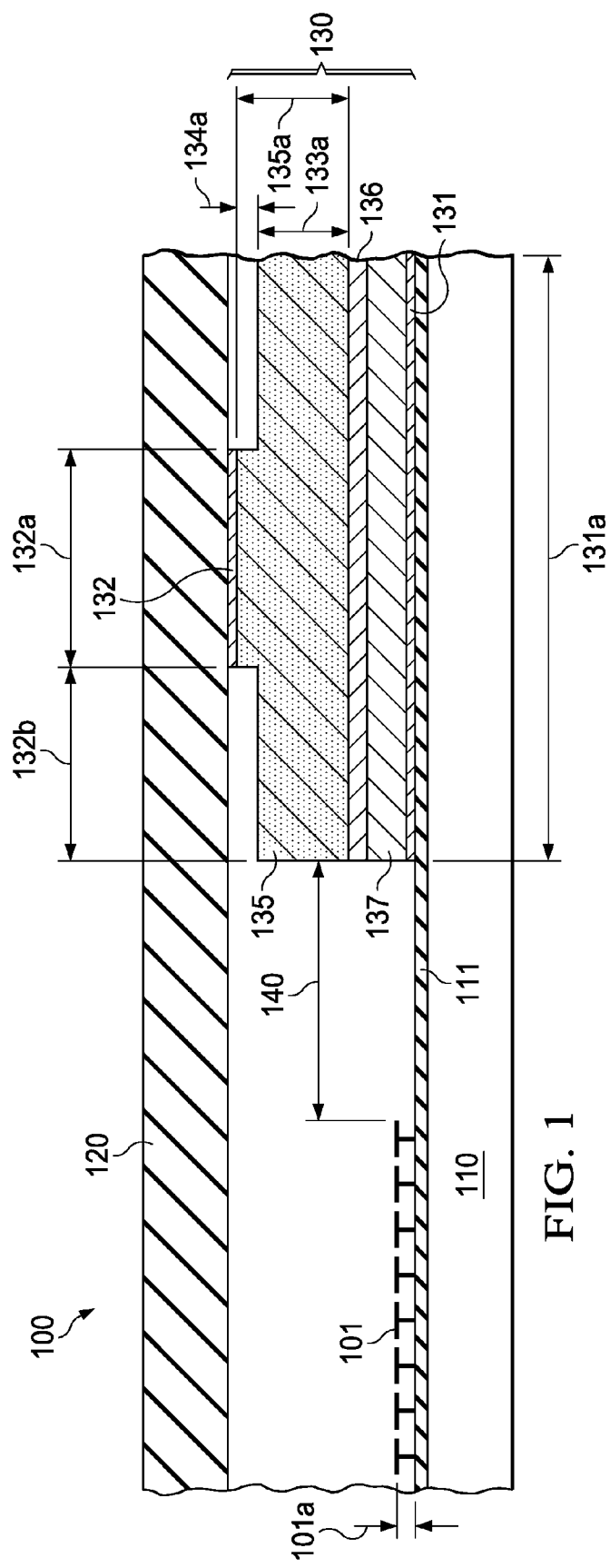
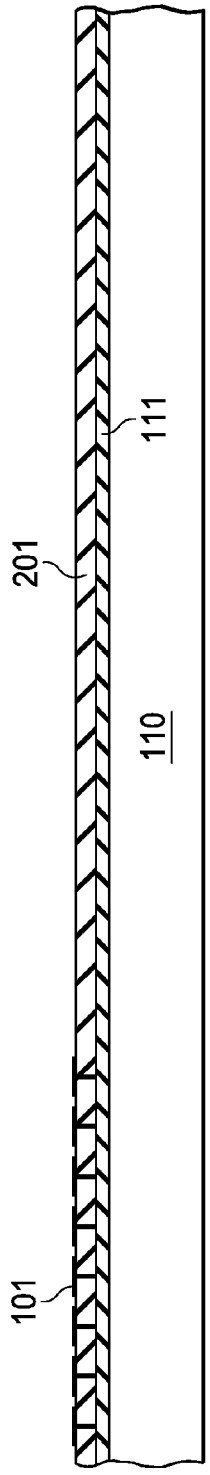
FIG. 1
FIG. 2

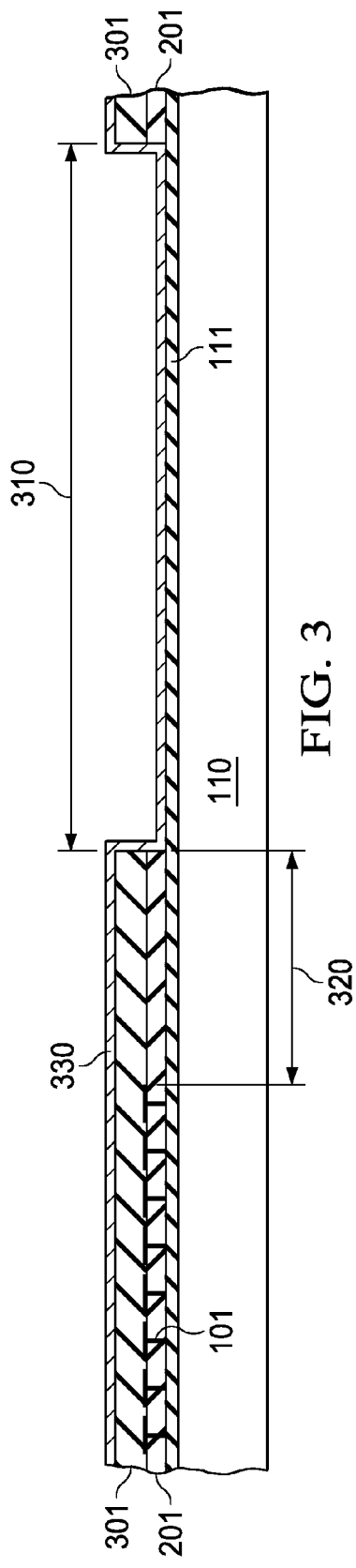
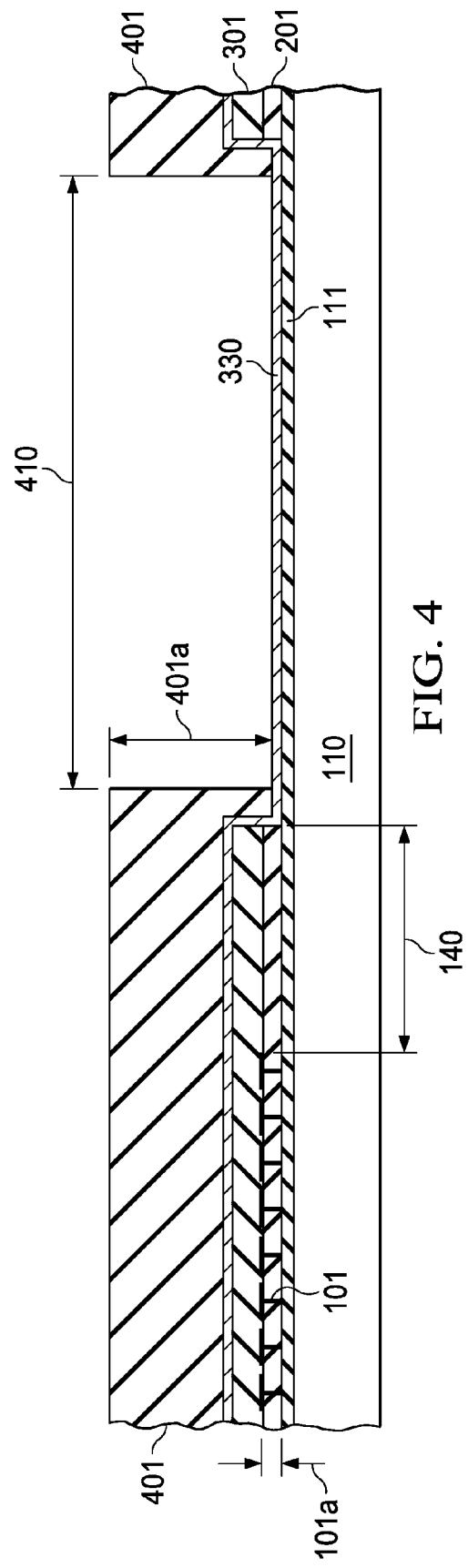

HERMETICALLY SEALED MEMS DEVICE AND ITS FABRICATION

This relates to semiconductor devices and processes, and more specifically to the structure and fabrication of hermetically sealed microelectromechanical system (MEMS) devices.

BACKGROUND

The wide variety of products collectively called microelectromechanical system (MEMS) devices are small, lightweight devices on the micrometer to millimeter scale, which may have mechanically moving parts and often movable electrical power supplies and controls, or they may have parts sensitive to thermal, acoustic, or optical energy. MEMS devices have been developed to sense mechanical, thermal, chemical, radiant, magnetic and biological quantities and inputs, and produce signals as outputs. Because of their moving and sensitive parts, MEMS devices have a need for physical and atmospheric protection. Consequently, MEMS devices are typically formed or placed on or in a substrate surrounded by an enclosed housing or package, which shields against ambient and electrical disturbances, and against stress.

A typical MEMS device integrates mechanical elements, sensors, actuators, and electronics on a common substrate. The manufacturing approach for such a device aims at using batch fabrication techniques similar to those used for other microelectronics devices. MEMS devices can thus benefit from mass production and minimized material consumption to lower their manufacturing cost, while simultaneously realizing the benefits of well-controlled integrated circuit processing technology.

Example MEMS devices include mechanical sensors, such as pressure sensors with microphone membranes and inertial sensors such as accelerometers, coupled with integrated electronic circuit of the chip. The mechanically moving parts of a MEMS device are fabricated together with the sensors and actuators in the process flow of the electronic integrated circuit (IC) on a semiconductor chip. The mechanically moving parts may be produced by an undercutting etch or removal of a sacrificial layer at some step during the IC fabrication. Examples of specific bulk micromachining processes employed in MEMS sensor production to create the movable elements and the cavities for their movements are anisotropic wet etching and deep reactive ion etching.

While the fabrication of these MEMS devices can benefit from wafer-level processes, their packages do not have to be fully hermetic, i.e., impermeable to water molecules. Consequently, they may use sealants made of polymeric compounds typically used in adhesive bonding. On the other hand, there are MEMS devices requiring substantially fully hermetic packages, such as digital micromirror devices (DMDs), which include torsion hinge DMDs, cantilever hinge DMDs and flexure hinge DMDs. Each movable mirror element of all three types of hinge DMD includes a relatively thick metal reflector supported in a normal, undeflected position by an integral, relatively thin metal hinge. In the normal position, the reflector is spaced from a substrate-supported underlying control electrode which may have a voltage selectively impressed thereon by an addressing circuit. A suitable voltage applied to the electrode can electrostatically attract the reflector to move or deflect it from its normal position toward the control electrode and the substrate. Such movement or deflection of the reflector causes deformation of its supporting hinge which stores potential energy that mechanically biases the reflector for movement back to its normal position when the attracting voltage is removed. The deformation of a cantilever hinge comprises bending about an axis normal to a hinge axis. The deformation of a torsion hinge comprises deformation by twisting about an axis parallel to the hinge axis. The deformation of a flexure hinge, which is a relatively long cantilever hine connected to the reflector by a relatively short torsion hinge, comprises both types of deformation, permitting the reflector to move in piston-like fashion.

An example DMD MEMS device is a spatial light modulator such as a DLP™ DMD device available from Texas Instruments.

A typical DMD includes an array of individually addressable light modulating pixel element micromirrors, the reflectors of each of which are selectively positioned to reflect or not to reflect light to a desired site. In order to avoid an accidental engagement of a reflector and its control electrode, a landing electrode may be added for each reflector. It has been found, though, that there is a risk that a deflected reflector may stick to or adhere to its associated landing electrode. It is postulated that such stiction (static friction that needs to be overcome to enable relative movement) effect may be caused by intermolecular attraction between the reflector and the landing electrode or by high surface energy substances adsorbed on the surface of the landing electrode and/or on the portion of the reflector which contacts the landing electrode. Substances which may impart such high surface energy to the reflector-landing electrode interface include water vapor or other ambient gases (e.g., carbon monoxide, carbon dioxide, oxygen, nitrogen) and gases and organic components resulting from or left behind following production of the DMD.

The problem of stiction has been addressed by applying selected numbers, durations, shapes and magnitudes of voltage pulses to the control electrode, or by passivating or lubricating the portion of the landing electrode engaged by the deformed reflector, and/or the portion of the deformed reflector which engages the landing electrode. Passivation is effected by lowering the surface energy of the landing electrode and/or the reflector through chemically vapor-depositing on the engageable surfaces a monolayer of a long-chain aliphatic halogenated polar compound, such as perfluoroalkyl acid. An effective method of passivation is to enclose a source of passivation, such as a predetermined quantity to time-released passivant material, in a closed cavity with the micromirrors at time of device manufacture.

Conventional hermetic packaging of MEMS devices usually involves a packaging process that departs from the processes normally used for non-MEMS device packaging. MEMS hermetic packaging is expensive not only because the package often includes a ceramic material, or a metallic or glass lid, but also because the package must be configured to avoid contact with moving and other sensitive parts of the MEMS device and to further allow a controlled or reduced atmosphere inside the package. The high package cost is, however, in conflict with market requirements for many applications of MEMS devices, which put a premium at low device cost and, therefore, low package cost.

Further, the conventional fabrication of hermetic MEMS packages also encounters many technical challenges, such as those caused by potentially high temperatures in connection with welding of a hermetic lid to the package base. As an example, a recently proposed package with a sealing process using a glass core involves temperatures considerably above 450° C., typically between 525 and 625° C. dependent on the sealing glass selected. These temperature ranges are a risk for the reliability of silicon integrated circuits and for proper functioning of many MEMS device components, and inhibit passivation and lubrication methods. Similar and sometimes even higher temperatures are involved when packages use techniques such as anodic bonding and glass frit bonding.

It would be advantageous to have a more fully hermetically packaged MEMS device which could target low cost industrial, automotive and consumer applications not currently reached by higher cost packaged devices.

It would be advantageous to have a more fully hermetically sealed MEMS device fabrication process flow in which both the front-end process flow as well as the packaging process flow would take advantage of semiconductor batch processing techniques applied in the fabrication of non-MEMS integrated circuit devices and would take advantage of installed automated machines.

It would be advantageous to have a more fully hermetically sealed MEMS device including appropriate passivating and lubricating agents, or controlled gaseous pressure in internal cavities.

SUMMARY

A MEMS device and a method for fabricating a MEMS device are disclosed.

In a described example method, a substrate is provided that includes a MEMS structure having at least a portion raised to a height above a substrate surface. A first seed layer is formed over the substrate surface. A first mask layer is formed over the first seed layer to a thickness greater than the height. The first mask layer is patterned with a first opening to expose an underlying portion of the first seed layer, with the first opening having a contour continuously peripherally surrounding the MEMS structure and laterally spaced from the MEMS structure. A first vertical stack of one or more metal layers is formed over the first seed layer within the first opening, the first stack including a top layer of a first metal. The patterned first mask layer is removed.

A cap material element is also provided. A second seed layer is formed over a surface of the cap material element. A second mask layer is formed over the second seed layer. The second mask layer is provided with a second opening to expose an underlying portion of the second seed layer, the second opening having a lateral continuous contour similar to but of lesser or greater lateral width than the contour of the first opening. A second vertical stack of one or more metal layers is formed over the second seed layer within the second opening, the second stack including a top layer of a second metal. The patterned second mask layer is removed.

The cap and the substrate are then aligned to bring the top layer of the second metal into contact with the top layer of the first metal, with a greater lateral spacing of the first or second metal of the top layer of lesser lateral width than the lateral spacing of the second or first metal of the top layer of greater lateral width from the MEMS structure. And, then, thermal energy is applied to liquefy and dissolve the one of the first and second metals having a lower melting temperature into the other of the first and second metals by forming one or more intermetallic compounds of the first and second metals.

BRIEF DESCRIPTION OF THE DRAWINGS

FIG. 1 shows a cross section of a portion of a MEMS device with a hermetically sealed cap forming a cavity over the MEMS, the cap attached to the substrate by a vertical stack of metal layers including gold-indium intermetallic compounds.

FIGS. 2 to 6 illustrate certain wafer-level process steps to fabricate metal layers surrounding MEMS structures suitable for hermetic sealing of packages.

FIG. 2 depicts the step of protecting surface MEMS structures on a substrate, after all surface MEMS processing steps have been completed.

FIG. 3 shows the steps of defining the package metal layout by patterning and etching, and of depositing a metallic seed film.

FIG. 4 illustrates the step of covering the metallic seed film with a patterned layer of polymeric material with a thickness limiting the height of the substrate package sealing metal.

FIG. 5 illustrates the step of filling the pattern openings with a stack of metal layers, the topmost metal being gold.

FIG. 6 depicts the steps of removing the patterned polymeric material, the exposed metallic seed film, and the MEMS structure protection.

FIG. 7 indicates the step of depositing a metallic seed film on a wafer-size cap material.

FIG. 8 depicts the step of covering the metallic seed film with a patterned layer of polymeric material with a thickness limiting the height of the cap metal for sealing the package.

FIG. 9 illustrates the step of filling the pattern openings with indium metal.

FIG. 10 shows the steps of removing the patterned polymeric material and the exposed metallic seed film.

DETAILED DESCRIPTION OF EXAMPLE EMBODIMENTS

Figure 5:
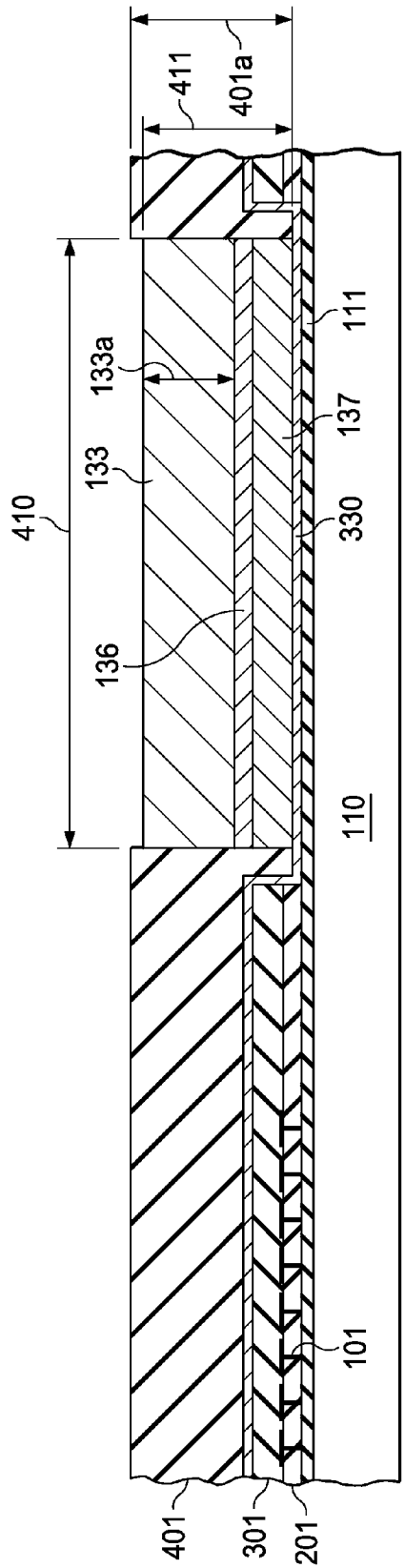

FIG. 1 illustrates a portion of an example hermetic package 100 for a microelectromechanical system (MEMS) structure 101. The package portion shown in FIG. 1 includes a substrate 110 and an example MEMS structure formed on a surface of the substrate 110. MEMS structure 101 has a first height 101a over the substrate surface. As an example, MEMS structure 101 may be an array of individually addressable micromirrors of a digital mirror device (DMD) such as a Texas Instruments DLP™ DMD spatial light modulator. In this case, first height 101a may for example be in the range of 0.5 µm to 1.5 µm. In other MEMS devices, first height 101a may be smaller or greater.

Substrate 110 may, for example, be a die or die area like that of an integrated circuit chip comprising semiconductor material such as silicon, silicon germanium, or gallium arsenide. Semiconductor chips are impermeable to water molecules and are thus hermetic. The substrate may include circuit components of an integrated circuit (IC) protected by an overcoat 111. In the package portion illustrated in FIG. 1, the protective overcoat 111 is depicted as covering the whole substrate surface so that overcoat 111 can be considered the effective substrate surface. In addition, the package of device 100 includes a cap or cover 120, which is configured to provide an enclosed cavity for housing MEMS structure 101. In example DMDs, cap 120 may include a flat glass plate or other structure providing transparency to enable external light of desired wavelengths to reach and be selectively modulated by position settable reflecting surfaces of structure 101. In other MEMS devices, cap 120 may be opaque, or may have a dome-shaped configuration. In any case, cap 120 is formed to be impermeable to water molecules and thus hermetic.

As illustrated in FIG. 1, cap 120 is attached to substrate 110 by a vertical stack 130 of metal layers. Stack 130 has a continuous contour that peripherally laterally surrounds MEMS structure 101 at a spacing distance 140 from MEMS structure 101. In example DMDs, distance 140 may be between 50 μm and 200 μm. The adhesion of stack 130 to substrate 110 may be enabled by a metallic seed film 131, and the adhesion of stack 130 to cap 120 may be enabled by a metallic seed film 132. In an example implementation, both seed films 131 and 132 include a coat of titanium about 100 nm thick and a coat of copper about 200 nm thick. The adhesion of stack 130 to substrate 110 and to cap 120 is made impermeable to water molecules and thus hermetic.

As illustrated in FIG. 1, seed film 131 has a first width 131a. In example DMDs, width 131a may be between about 100 μm and 150 μm. Seed film 132 has a second width 132a smaller than width 131a. In example DMDs, width 132a may be between about 50 μm and 80 μm.

Vertical stack 130 of FIG. 1 includes a plurality of metal layers and has a cross section of varying width. A lower part of stack 130 joins seed film 131 and has a generally uniform width that matches width 131a of seed film 131. An upper part of stack 130 joins seed film 132 and has a width that is tapered or stepped upwardly and inwardly from width 131a of seed film 131 to width 132a of seed film 132. As illustrated in embodiment 100 of FIG. 1, metal stack 130 includes a plurality of layers 135, 136 and 137. In other MEMS device implementations, layer 137 or layer 136, or both, may be omitted, or an additional one or more metal layers may be added.

In an example implementation, bottom layer 137 is joined to seed film 131, is made of copper, and has a thickness of about 2 μm. Intermediate layer 136 is joined to layer 137, is made of nickel, and has a thickness of about 1 μm. Top layer 135 is a metal layer that has its bottom joined to intermediate layer 136, its top joined to seed film 132, and a width that varies upwardly and inwardly from first width 131a to second width 132a. A lower portion of layer 135 of generally uniform first width 131a has a thickness 133a of between about 5 μm and 10 μm, and an upper portion of layer 135 of tapered or stepped width has a thickness 134a of between about 2 μm and 4 μm. For some MEMS devices enhanced adhesion can be achieved by the addition of a nickel layer of about 1 μm thickness between the upper portion of thickness 134a and seed film 132.

For the example MEMS device illustrated in FIG. 1, metal layer 135 includes gold-indium intermetallic compounds of various compositions, for instance AuIn$_8$ with a melting temperature of about 540° C. and AuIn with a melting temperature of about 509° C. In addition, metal layer 135 may include metallic gold not consumed by intermetallic compounds. As explained below, with gold provided with a wider bond line than indium during fabrication and in an amount considerably more plentiful than the amount of indium, the increase of temperature allows the gold surface to react with any excess indium, capturing it as intermetallic compounds.

An example embodiment of a wafer-level process for the fabrication of low temperature hermetically sealed MEMS structure devices is illustrated with reference to FIGS. 2 to 11.

FIG. 2 shows an unsingulated die area of a substrate 110 such as a die area of an integrated circuit of a semiconductor wafer 110 at a process stage where the initial processing of MEMS structures 101 has been completed. The die areas of wafer 110 may include circuitry for each chip, such as integrated circuits manufactured by CMOS technology. The circuitry includes is electrically connected to the respective MEMS structures. Wafer 110 is covered by a layer 111 of protective overcoat material such as silicon nitride and silicon carbide. In the illustrated embodiment, movable portions of the MEMS structures 101 are shown above the wafer surface, i.e., above the overcoat layer 111, by a height 101a. For example DMDs, for example, height 101a may be in a range of about 0.5 μm to 1.5 μm. The MEMS structures (e.g., movable mirrors of a DMD) are advantageously supported by a protective polymeric material 201 such as a layer of photoresist, which can be sacrificed and removed at a later stage of the process flow. It is a technical advantage that the steps of forming the packaging, bonding, and sealing features begin only after the surface MEMS initial processing is complete so that integration issues caused by structure topology may be prevented.

The layout of the package features is next defined and the substrate surface is covered with a patterned metallic seed film for anchoring the package sealing structures.

In order to pattern protective layer 201, a photoresist layer 301 (see FIG. 3) is deposited over protective layer 201 and patterned using photolithography steps to expose a portion of protective layer 201 for removal. Protective layer 201 is then selectively etched to create an opening of lateral width 310, with a portion of overcoat 111 exposed in the opening of width 310. Opening 310 follows a continuous contour laterally peripherally surrounding the MEMS structure 101 and spaced by a distance 320 therefrom.

Also as illustrated in FIG. 3, a metallic seed film 330 is then blanket deposited over the patterned photoresist layer 301 and within the opening 310. Metallic seed film 330 is of a material that has strong adhesion to overcoat 111. In one implementation, film 330 may include about 100 nm thickness of titanium facing the overcoat 111 and about 200 nm thickness of copper facing away from the overcoat 111.

As illustrated in FIG. 4, seed film 330 is next covered with another layer of a polymeric material, such as another photoresist layer 401. Layer 401 is formed to a height 401a greater than first height 101a. In example micromirror MEMS structures, height 401a may be between about 8 μm and 10 μm, and for other example MEMS structures between about 10 μm and 20 μm.

Photoresist layer 401 is then patterned to provide an opening of width 410 to expose a portion of the seed film 330 about the same size (less slightly more than the thickness of seed film 330 to laterally space vertical portions of the seed film 330 from the stack subsequently formed as described below) as the portion of overcoat 111 previously exposed by opening 310 (see FIG. 3). Width 410 may, for example, be between about 100 μm and 150 μm. Opening 410 has the same general two-dimensional continuous contour configuration as the opening of width 310 previously formed in protective layer 111 (see FIG. 3) and is spaced by distance 140 from the MEMS structure 101. Distance 140 may, for example, be between about 50 μm and 200 μm and have approximately the same size (plus slightly more than the thickness of seed film 330) as distance 320 (see FIG. 3).

FIG. 5 illustrates the formation of a vertical stack of metal layers within the opening of width 410. The layers are deposited sequentially, such as by a plating process, all with the same first width 410. In one example, a bottom layer 137 of about 2 μm thickness is formed that adheres to metallic seed film 330 on the overcoat 111 exposed at the bottom of the opening. Next, a barrier layer 136 of, for example, nickel of about 1 μm thickness is formed over the copper layer 137. And, then, a top layer 133 of gold of a thickness 133a between about 5 μm and 10 μm is formed over the barrier layer 136. The sum of the thicknesses of layers 137, 136, and 133 provides a stack height 411 that is equal to or less than the height 401a of the patterned photoresist layer 401 from the top of film 330 in the opening of width 410 to the top of the layer 401. In other MEMS device implementations, one or both of layers 136, 137 may be omitted. In such case, height 133a of gold layer 133 which is less than height 401a may be increased to a total thickness that approaches height 401a.

Figure 6:
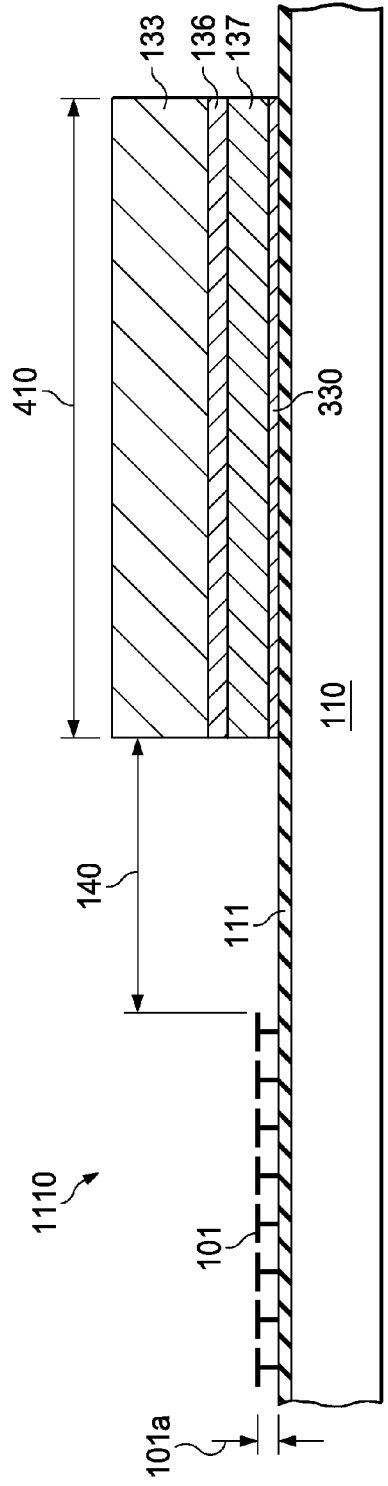

As shown in FIG. 6, photoresist layer 401 is then removed by a photoresist removal process and exposed portions of seed film 330 not covered by the stack of metal layers 137, 136, 133, are removed such as by etching using a chemical or plasma etch technique. MEMS structures 101 are then released and freed for movement by removing remaining portions of the patterned photoresist layer 301 and the underlying sacrificial layer 201 which served to protect MEMS structures 101 during earlier fabrication steps. This may be done, for example, using plasma etching. As FIG. 6 shows, the result of these processes is a structure designated 1110 that comprises the substrate 110 with MEMS structures 101 of height 101a over the substrate upper surface and with a vertical stack of metal layers 137, 136, 133 of width 410 laterally continuously surrounding and spaced by a distance 140 from the MEMS structures 101.

FIGS. 7 to 10 depict steps in the wafer-level fabrication of water impermeable caps suitable for joinder to the wafer-level structure 1110 for hermetically sealing the MEMS structures formed on the die areas of the substrate.

Figure 7:
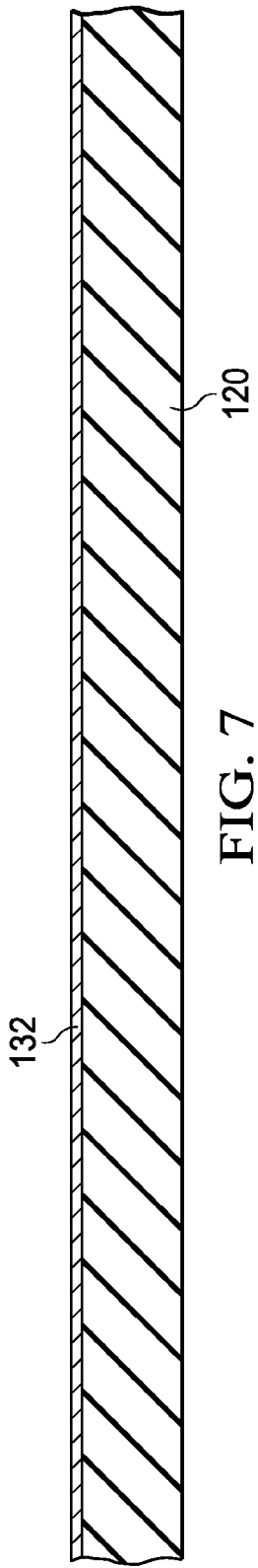
FIGS. 7 to 10 show certain wafer-level process steps to fabricate caps with metallization to complete the sealing of hermetic MEMS packages.

FIG. 7 indicates the step of providing a flat cap 120 with a surface with a metallic seed film 132 suitable for DMD devices. The illustrated cap 120 may be made of a glass transparent to visible light, and the metallic seed film 132 may include a layer of titanium of about 100 nm thickness and a layer of copper of about 200 nm thickness. Cap 120 is formed on a wafer scale basis and thus compatible with a wafer scale package assembly for the MEMS structures. Although a flat cap 120 is used for illustrative purposes, it will be appreciated that the configuration of the cap structure may be a vaulted dome or other configuration different than a flat cap, with the specific configuration determined based on the type and configuration of MEMS structure involved and also in consideration of other particular needs and individual preferences.

Figure 8:
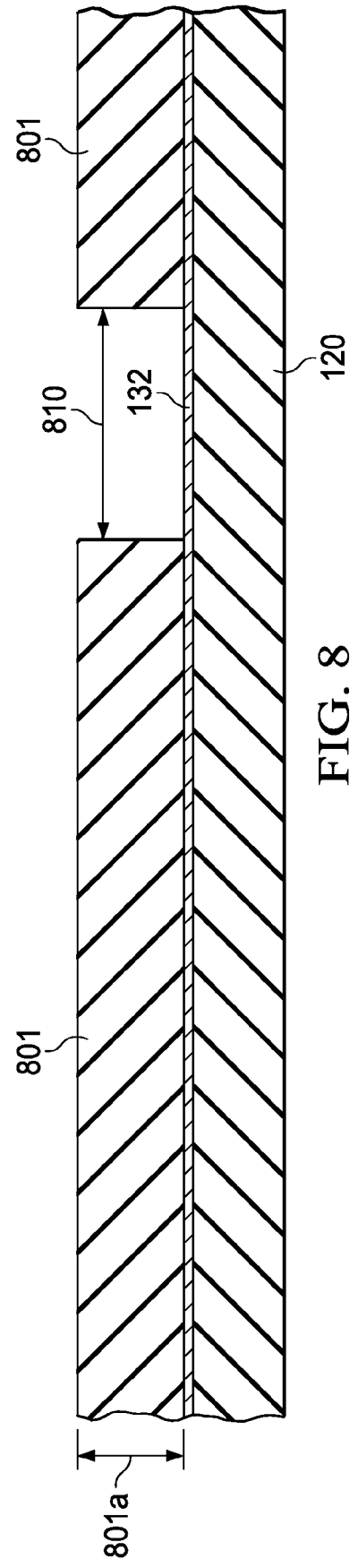

In FIG. 8, metallic seed film 132 is covered with a layer of a polymeric material such as a photoresist layer 801 to a thickness of height 801a which is smaller than height 133a of gold layer 133 described previously. Photoresist layer 801 is patterned to provide an opening of width 810 less than width 410 which exposes a portion of the metallic seed film 132. The opening of width 810 has the same general two-dimensional continuous contour configuration as the opening of width 410 previously described, and is positioned so that the opening with width 810 may be brought into alignment generally centrally of the width of the bottom of the stack of layers 137, 136, 133 in later processing.

Figure 9:
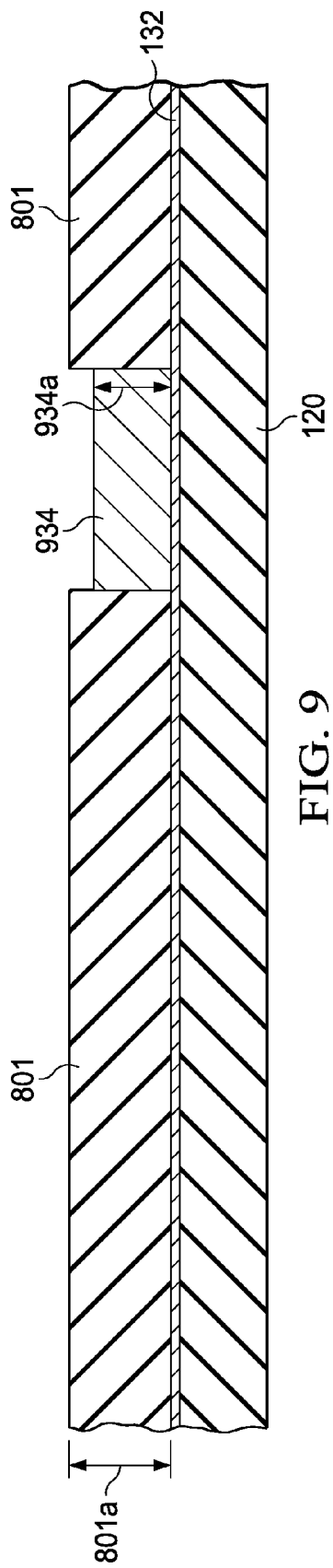

As illustrated in FIG. 9, a layer 934 of metal, for example, indium, suitable to form intermetallics with the metal of layer 133 is then formed to a thickness of height 934a less than or equal to height 801a within the opening of width 810. In example DMD devices, layer 934 may be formed to a height 934a of between about 2 μm and 4 μm. Advantageously, a barrier layer of, for example, nickel to a thickness of about 1 μm may be deposited on the exposed portion of the metallic seed film 132 before the indium metal 934 is deposited.

In some implementations, metal layer 934 may be a composite metal layer comprising a plurality of successively formed metal layers, such as a bottom layer of about 200 nm thickness of titanium deposited over the metallic seed layer 132, followed by an intermediate layer of indium deposited over the titanium, and then a top layer of gold of about 100 nm thickness deposited over the indium intermediate layer.

Figure 10:
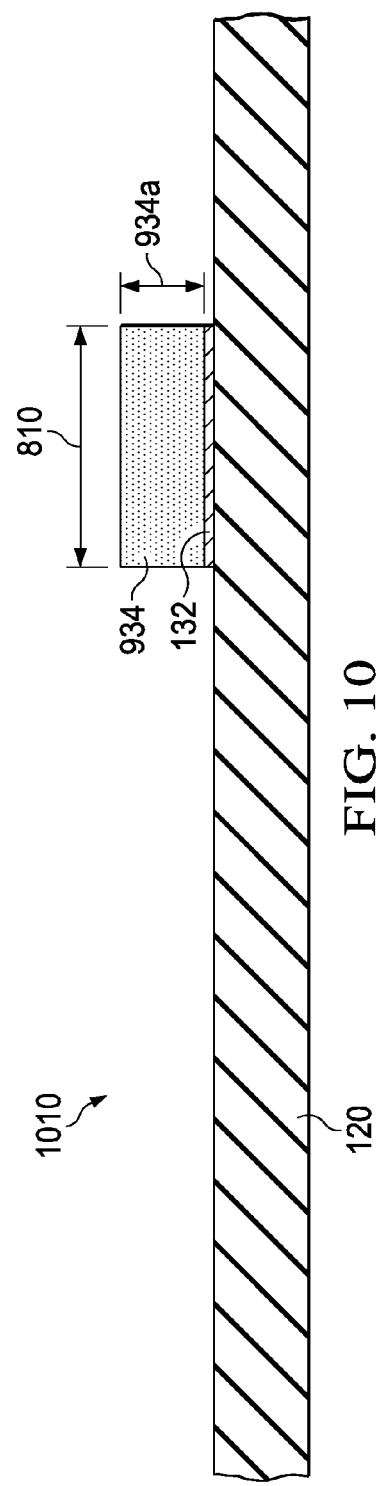

As shown in FIG. 10, the patterned photoresist layer 801 is removed after deposition of the metal layer 934, followed by the removal of the portion of the metallic seed film 132 not covered by the metal layer 934. This results in a wafer scale cap structure 1010 comprising the metal layer 934 (viz., indium) of width 810 and height 934a adhered to the surface of flat cap material 120 through the remaining width 810 portion of metallic seed film 132. As mentioned, indium layer 934 and remaining seed film 132 are configured to match and fall within the outline of gold layer 133 formed on substrate 110. At this stage, the cap structure 1010 is ready to be used for the wafer-scale assembly of hermetic packages for the MEMS structures. The cap is designated 1010.

For some MEMS devices, such as DMDs, chemical gettering substances, lubricants, corrosion inhabitants and/or other materials may be added prior to or contemporaneously with sealingly joining the cap and substrate structures 1010, 1110.

Figure 11:
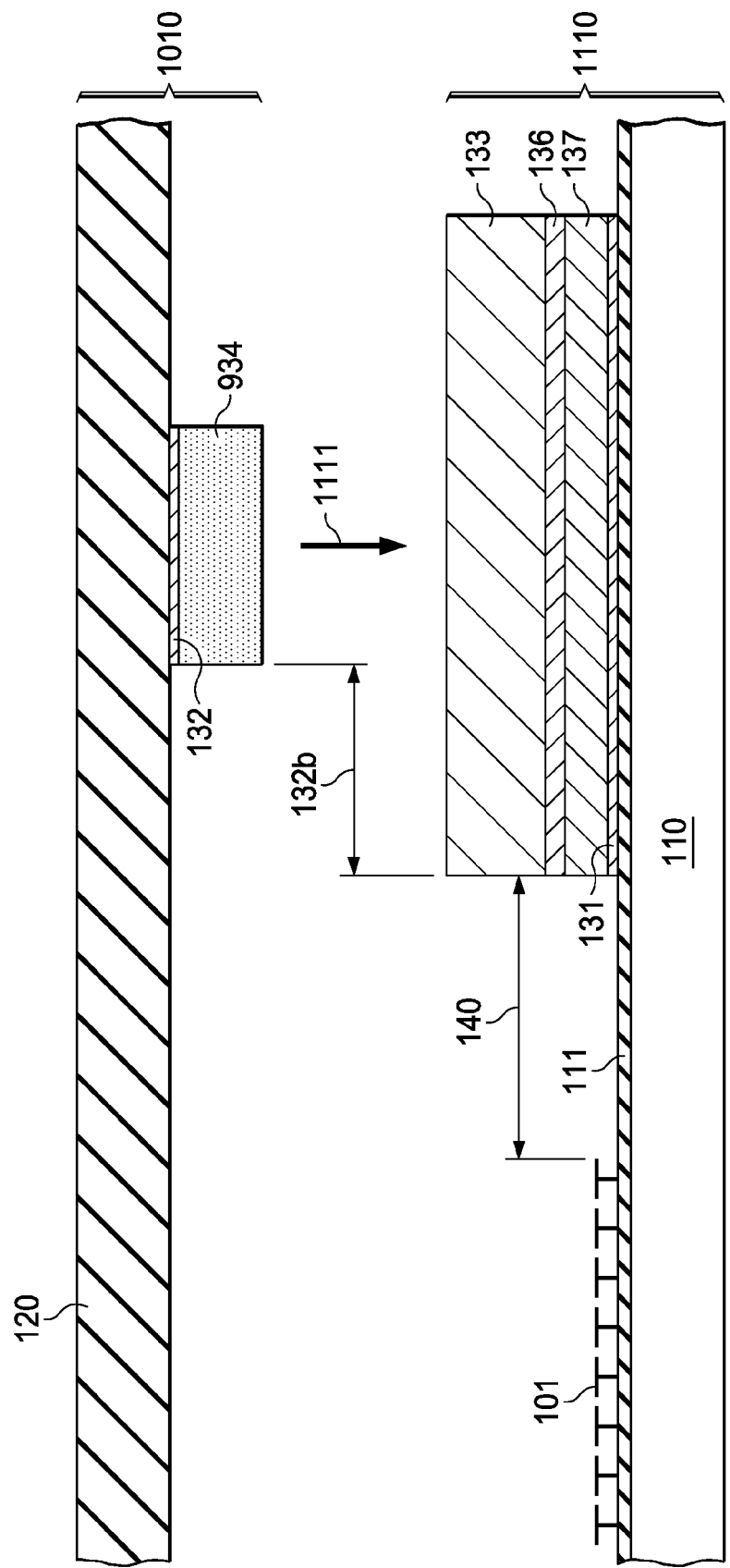
FIG. 11 illustrates the package assembly steps by aligning the cap metal with the substrate stack of metals to contact indium and gold layers.

FIG. 11 illustrates the package assembly step. Cap 1010 is aligned with substrate 1110 so that indium layer 934 is facing gold layer 133. In FIG. 11, indium layer 934 is approximately centered above gold layer 133, leaving a lateral distance 132b from the inside perimeter edge of the laterally continuous contour of indium layer 934 to the corresponding inside perimeter edge of the similar laterally continuous contour of gold layer 133. Cap 1010 is then lowered (indicated by arrow 1111) onto substrate 1110 in order to bring indium layer 934 into contact with gold layer 133, resulting in an asymmetrical bond line width, wherein the indium width at the bond line is narrower (in typical embodiments, significantly narrower) than the gold width at the bond line.

Without delay and with the indium layer and gold layer in contact, thermal energy is applied in order to raise the temperature until the indium metal is liquefied at about 156° C. It is preferred to keep the temperature between about 156 and 200° C., since this temperature range is low compared to typical processing temperatures of silicon components and MEMS structures. Since the amount of indium is small relative to the amount of gold, after a short period of time the indium metal is dissolved into the gold layer by forming gold-indium intermetallic compounds (the interaction is often referred to as a transient liquid phase process). Among the formed compounds are the indium-rich compound $AuIn_8$ and the compound AuIn. The oversized gold surface (relative to the indium surface in contact with the gold surface) acts to capture excess liquid indium to form intermetallic compounds before liquid indium can enter sidewise into the MEMS structure headspace. An occasional residual indium metal squeezed sidewise is neutralized by the distance 140 of the Au perimeter to the MEMS structures 101. As indicated in FIG. 1, the resulting layer of intermetallics and residual gold is designated 135. The insertion of barrier layer 136 of nickel effectively blocks an interaction of gold with copper of layer 137 within the stated low temperature range. However, even in the absence of the nickel layer, gold will interact much more slowly with copper than with indium.

After the transient liquid phase wafer-level assembly process described with reference to FIG. 11, the resulting MEMS packages shown in FIG. 1 are formed. The packages all have metal stacks 130 which adhere to the substrate (silicon wafer) 110 as well as to the cap (glass plate) 120 and are thus substantially fully hermetic. The wafer can subsequently be singulated into discrete MEMS devices, for instance by sawing the wafer to separate the die areas into discrete die packages.

In contrast to the low temperature range of 156 to 200° C. for forming gold-indium intermetallics, any re-melting of the intermetallic compounds would require much higher temperatures, for example about 509° C. for AuIn and about 540° C. for $AuIn_8$. Consequently, additional device processing after package assembly is possible with less concern about thermal degradation of the hermetic seal. An example is the solder processes utilized for attachment to external parts such as other components and circuit boards.

The described example embodiments are merely illustrative and not intended to be construed in a limiting sense. The disclosed principles apply to any semiconductor material for the chips, including silicon, silicon germanium, gallium arsenide, or any other semiconductor or compound material used in manufacturing. The same principles may be applied both to MEMS components formed over the substrate surface and to MEMS components formed within the substrate. The caps used in packaging the components may be flat, curves or any other geometry that suits individual needs and preferences. The caps may be made transparent, selectively transparent or completely opaque to all or specific wavelengths or ranges of wavelengths of visible light, infrared light, radio frequency or radiation in other portions of the electromagnetic spectrum.

The contacting metal layers of the stacks formed on the substrate and cap may be other than gold and indium, with other suitable choices being disclosed in application Ser. No. 13/671,734 filed Nov. 8, 2012, the entirety of which is incorporated by reference herein. Also, the relative widths of the metal stacks can be reversed, with the wider stack being formed on the cap and the narrower stack being formed on the substrate. In such case, the top layer of the wider stack formed on the cap instead of the substrate will be formed of the higher melting temperature metal (e.g., gold) and the top layer of the narrower stack formed on the substrate instead of the cap will be formed of the lower melting temperature metal. In such case, too, it may be advantageous to join the substrate from above to the cap, rather than join the cap from above to the substrate, to assist collection of liquefied lower melting temperature metal on the wider higher melting temperature metal.

For fully hermetic MEMS packages, the described approach realized that general eutectic bonding may offer low temperature sealing of packages and thus be compatible with low temperature MEMS structures, but the resulting seals would de-bond at the same low temperatures as the sealing process and thus not allow post-sealing temperatures above the sealing temperature as required by some customer board assembly and device operations.

The problem is addressed of sealing low cost hermetic packages at low temperatures—and thus permitting lubrication of surface MEMS structures—but allowing device operation at temperatures significantly above the sealing temperature. In the example gold/indium system approach a methodology is based on a transient liquid phase sealing technique at low temperatures, which creates intermetallic compounds re-melting only at much higher temperatures. Yet, in a configuration wherein the gold amount is in excess, the indium amount is restricted and kept within confined borders. In the described process flow, indium and gold are kept separate until immediately before sealing, creating a thermally stable solution. Making the indium bond line asymmetrical relative to the gold bond line, and especially selecting an indium bond line significantly narrower than the gold bond line, allows the gold surface to react with any excess indium before it can enter the MEMS device area, capturing the indium as intermetallic compounds.

In an example new package design, the package structures are electrically isolated from the MEMS structures. The temperature range, in which the indium is consumed by the gold, does not have to be not much higher than the indium melting temperature (156.63° C.) and is preferably in the range from about 156 to 200° C. On the other hand, the re-melting temperatures of indium-gold intermetallic compounds are much higher: for AuIn 509.6° C., for $AuIn_8$ 540.7° C. It is thus a technical advantage for hermetic low temperature MEMS structures (especially with the need for temperature-sensitive lubricants) that the assembly temperature can be kept under 200° C., while applications and operations at much higher post-assembly temperatures can reliably be tolerated. Another advantage is that the cost of hermetic MEMS packages fabricated by this method compares well with the cost of conventional non-hermetic MEMS packages.

The described example packaging method separates indium and gold from each other until right at the assembly step, thus creating a thermally stable solution in contrast to known methods, where indium bodies are placed in contact with gold bodies during the fabrication process. Since indium and gold diffuse rapidly at elevated temperatures, and significantly even at ambient temperature, intermetallic compounds are continuously produced at these interfaces. When the assembly temperature is reached, the intermetallic compounds do not re-melt and can thus not participate in the bonding process. Consequently, these interfaces may not be thermally stable at ambient temperature, are preferably not exposed before assembly to processing steps requiring elevated temperatures, and have limited shelf life before assembly.

The described example packaging method uses asymmetrical bond line widths. In particular, the indium bond line is significantly narrower than the gold bond line. Consequently, the gold surface can react with any excess indium and can capture it as intermetallic compounds. With contacting surfaces of the indium body and the gold body at the same width, as melted indium has a strong tendency to push out of a bonding surface during an assembly step, there may be a greater chance to enter the MEMS device area.

Those skilled in the art will appreciate that many other embodiments and variations are possible within the scope of the claimed invention.

What is claimed is:

1. A method for fabricating a MEMS device, comprising:
providing a substrate including a MEMS structure having at least a portion raised to a height above a substrate surface;
forming a first seed layer over the substrate surface;
forming a first mask layer over the first seed layer to a thickness greater than the height;
patterning the first mask layer with a first opening to expose an underlying portion of the first seed layer, the first opening having a contour continuously peripherally surrounding the MEMS structure and laterally spaced from the MEMS structure;
forming a first vertical stack of one or more metal layers over the first seed layer within the first opening, the first stack including a top layer of a first metal;
removing the patterned first mask layer and a part of the first seed layer not covered by the first vertical stack within the first opening;
providing a cap material element;
forming a second seed layer over a surface of the cap material element;
forming a second mask layer over the second seed layer;
patterning the second mask layer with a second opening to expose an underlying portion of the second seed layer, the second opening having a lateral continuous contour similar to but of lesser or greater lateral width than the contour of the first opening;

forming a second vertical stack of one or more metal layers over the second seed layer within the second opening, the second stack including a top layer of a second metal;

removing the patterned second mask layer and a part of the second seed layer not covered by the second vertical stack within the second opening;

aligning the cap and the substrate to bring the top layer of the second metal into contact with the top layer of the first metal, with a greater lateral spacing of the first or second metal of the top layer of lesser lateral width than the lateral spacing of the second or first metal of the top layer of greater lateral width from the MEMS structure; and applying thermal energy to the one of the first and second metals having a lower melting temperature to liquefy and dissolve the one of the first and second metals into the other of the first and second metals by forming one or more intermetallic compounds of the first and second metals.

2. The method of claim 1, wherein the one or more intermetallic compounds have melting temperatures greater than the melting temperature of the one of the first and second metals and less than the melting temperature of the other of the first and second metals.

3. The method of claim 1, wherein melting temperatures of the other of the first and second metals and of the one or more intermetallic compounds are greater than 260° C.

4. The method of claim 3, wherein the melting temperature of the one of the first and second metals is less than 260° C.

5. The method of claim 1, wherein the one of the first and second metals is indium and the other of the first and second metals is gold.

6. The method of claim 1, wherein the second opening has a contour of substantially lesser width than the contour of the first opening; and the first metal has a higher melting temperature than the second metal.

7. A method for fabricating a MEMS device, comprising:
providing a substrate including a MEMS structure having at least a portion raised to a height above a substrate surface;
forming a first metal seed layer over the substrate surface;
forming a first mask layer over the first metal seed layer to a thickness greater than the height;
patterning the first mask layer with a first opening to expose an underlying portion of the first metal seed layer, the first opening having a contour continuously peripherally surrounding the MEMS structure and laterally spaced from the MEMS structure;
forming a first vertical stack of one or more metal layers over the first seed layer within the first opening, the first stack including a top layer of a first metal;
removing the patterned first mask layer;
providing a cap material element;
forming a second metal seed layer over a surface of the cap material element;
forming a second mask layer over the second metal seed layer;
patterning the second mask layer with a second opening to expose an underlying portion of the second metal seed layer, the second opening having a lateral continuous contour similar to but of lesser lateral width than the contour of the first opening;
forming a second vertical stack of one or more metal layers over the second seed layer within the second opening, the second stack including a top layer of indium;
removing the patterned second mask layer;

aligning the cap and the substrate to bring the top layer of indium into contact with the top layer of gold, with a greater lateral spacing of the indium than the lateral spacing of the gold from the MEMS structure; and applying thermal energy to liquefy and dissolve the indium into the gold by forming one or more intermetallic compounds of the gold and indium.

8. A method for fabricating a MEMS package comprising the steps of:
providing a substrate having a surface with a MEMS structure of a first height above the surface;
covering the surface with a metallic seed film adhering to the substrate;
covering the seed film with a patterned layer of a polymeric material, the layer having a second height greater than the first height, the pattern including an opening to the seed film, the opening having a first width and a continuous outline surrounding the MEMS structure while spaced from the MEMS structure by a distance;
filling the opening by depositing sequentially metal layers adhering to the seed film including a top gold layer of first width and a third height equal to or less than the second height;
removing the layer of polymeric material and seed film portions not covered by the metal layers;
then providing a cap having a surface with a metallic seed film of a second width smaller than the first width and an adhering indium layer of second width and a fourth height smaller than the third height, the seed film and the indium layer configured to match the outline of the gold layer;
aligning the cap and the substrate to bring the indium layer into contact with the gold layer; and
applying thermal energy to liquefy the indium layer and dissolve the indium into the gold layer by forming gold-indium intermetallic compounds adhering to the seed film on the cap surface.

9. The method of claim 8, wherein the thermal energy raises the temperature between about 156 and 200° C.

10. The method of claim 8, wherein the MEMS structure is a micromirror array and the cap is a flat plate transparent to at least some wavelengths of light.

11. The method of claim 10, wherein the first width is between about 100 µm and 150 µm; the second width is between about 50 µm and 80 µm; the height of the gold layer is between about 5 and 10 µm; and the height of the indium layer is between about 2 µm and 4 µm.

12. The method of claim 8, wherein the cap further includes a nickel layer of second width and about 1 µm thickness inserted between the indium layer and the metallic seed film.

13. The method of claim 8, wherein the metal layers filled into the opening further comprise a vertical stack including a bottom layer of copper about 2 µm thick adhering to the seed film of the substrate surface, a barrier layer of nickel about 1 µm thick, and the top layer of gold with a thickness between about 5 and 10 µm.

14. The method of claim 8, wherein the metallic seed film includes about 100 nm of titanium and about 200 nm of copper over the titanium.

15. The method of claim 8, wherein the substrate and the cap comprise materials that are impermeable to water molecules; and the gold-indium intermetallic compounds adhering to the cap surface and the metal layers adhering to the substrate surface seal the cavity confined by substrate, cap, and intermetallic compounds, whereby the cavity is protected from ingress of water molecules.

16. The method of claim 8, further including, after the step of removing, the step of adding passivating and lubricating material to the MEMS structure.

17. The method of claim 8, wherein providing the cap comprises:
- providing a cap having a surface covered by a metallic seed film;
- covering the metallic seed film with a layer of a polymeric material having a fourth height smaller than the third height and a pattern providing a window to the metallic seed film, the window having a second width smaller than the first width and an outline matching the outline of the opening;
- filling the window by depositing a layer of indium having a height equal to or smaller than the fourth height; and
- removing the layer of polymeric material and the metallic seed film outside the second width of the indium layer.

18. The method of claim 17, further including, before the step of filling, the step of depositing a layer of nickel to a thickness of about 1 µm onto the metallic seed film; and wherein the metallic seed film includes about 100 nm of titanium and about 200 nm of copper over the titanium.

19. A hermetic package of a microelectromechanical system (MEMS) structure comprising:
- a substrate having a surface with a MEMS structure of a first height, the substrate hermetically sealed to a cap forming a cavity over the MEMS structure;
- the cap attached to the substrate surface by a vertical stack of metal layers adhering to the substrate surface and to the cap, the stack having a continuous outline surrounding the MEMS structure while spaced from the MEMS structure by a distance; and
- the stack having a bottom metal seed film adhering to the substrate with a first width, and further a top metal seed film adhering to the cap with a second width smaller than the first width, the top metal seed film tied to a metal layer including gold-indium intermetallic compounds, the metal layer having a height greater than the first height.

20. The package of claim 19 wherein the substrate includes integrated circuitry; the MEMS structure has a first height between about 0.5 µm and 1.5 µm; the top metal seed film includes about 100 nm of titanium and about 200 nm of copper over the titanium; and a layer of nickel is further included between the top metal seed film and the layer including gold-indium intermetallic compounds.

21. The package of claim 19, wherein the metal layer includes a layer of copper between the gold-indium intermetallic compounds and the bottom metal seed film.

* * * * *